Feb. 23, 1954 J. H. FELKER 2,670,445
REGENERATIVE TRANSISTOR AMPLIFIER
Filed Nov. 6, 1951 4 Sheets-Sheet 1

INVENTOR
J. H. FELKER
BY H. A. Burgess
ATTORNEY

Feb. 23, 1954 J. H. FELKER 2,670,445

REGENERATIVE TRANSISTOR AMPLIFIER

Filed Nov. 6, 1951 4 Sheets-Sheet 2

INVENTOR
J. H. FELKER
BY H. A. Burgess
ATTORNEY

INVENTOR
J. H. FELKER
BY
H. A. Burgess
ATTORNEY

INVENTOR
J. H. FELKER
BY H. A. Burgess
ATTORNEY

UNITED STATES PATENT OFFICE 2,670,445

REGENERATIVE TRANSISTOR AMPLIFIER

Jean H. Felker, Livingston, N. J., assignor to Bell Telephone Laboratories, Incorporated, New York, N. Y., a corporation of New York Application November 6, 1951, Serial No. 255,043

7 Claims. (Cl. 307—88)

This invention relates generally to transistor pulse amplifiers and more particularly, although not exclusively, to transistor pulse amplifiers suitable for use in high-speed switching systems and computers.

The principal object of the invention is to amplify and reshape low-level pulse type signals.

A related object is to provide a high-speed transistor amplifier of sufficient flexibility for use everywhere that gain is required in a pulse-operated switching system or computer.

In its principal aspect, the present invention takes the form of a regenerative pulse amplifier comprising a single-transistor flip-flop circuit which is triggered to its high current state by signal pulses fed to the transistor emitter and is reset to its low current state by a regular succession of pulses fed to the transistor base. The amplifier is provided with a high input impedance by an emitter "load-line" resistor returned from the emitter to a direct potential of the polarity required to bias that electrode in the so-called forward direction, while high current gain is obtained by using the negative input impedance of the transistor to switch to the low impedance provided by a crystal diode returned from the emitter to another direct potential. The two direct potentials mentioned are chosen so that one is above and the other is below the quiescent level of the transistor base and are generally of opposite polarity. The reset pulses applied to the transistor base provide high-speed operation and control the onset and the duration of the pulses generated by the amplifier, making the output pulses substantially independent of the transistor and circuit parameters and the shape of the input pulses.

The invention also features a crystal diode which is poled oppositely to the direction of positive emitter current flow connected in series between the signal pulse input terminal and the emitter to isolate the emitter circuit from the preceding circuits and, in conjunction with the other diode connected to the emitter, to provide direct-current restoration of incoming signal pulses. Direct-current restoration forces the signal input pulses always to start from a predetermined direct voltage level and enhances the reliability and accuracy of the amplifier, while isolation of the emitter circuit frees the signal input terminal from any requirement of following the excursions in potential of the emitter once the circuit has been triggered.

Transistor pulse amplifiers embodying the present invention are particularly adaptable for use in high-speed switching and digital computer systems. They are capable of generating standardized pulses of uniform amplitude in response to input pulses which exceed a minimum threshold level. They are also capable of the basic operation in computer applications of inhibition; that is, their normal operation of generating pulses under the control of signal pulses can be inhibited by the application of suitable inhibiting pulses. In accordance with a feature of the invention, inhibiting pulses may be applied to the transistor base in the intervals between reset pulses to prevent the generation of output pulses during these intervals.

A more thorough understanding of the invention may be secured from a study of the following description of several specific embodiments. In the drawings.

Figure 3A:
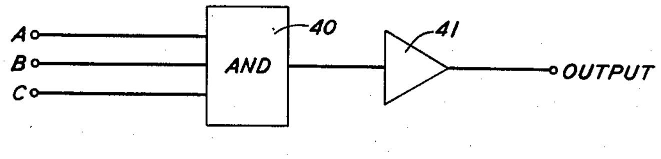
Figure 3B:
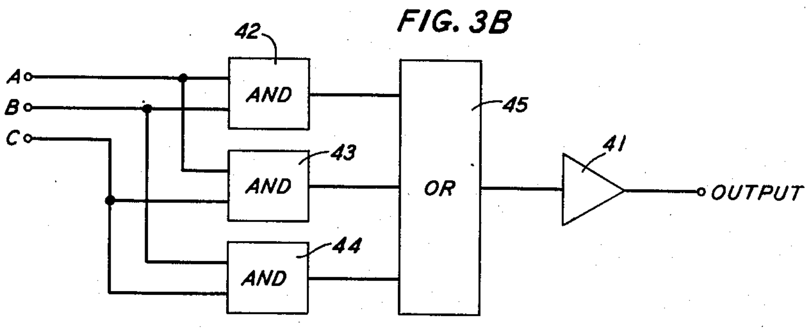
Figure 3C:
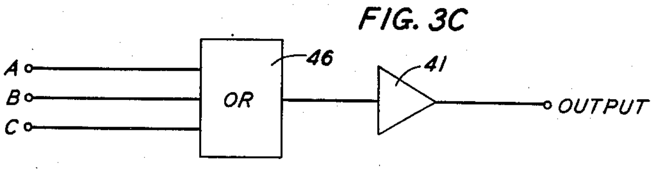
Figure 4B:
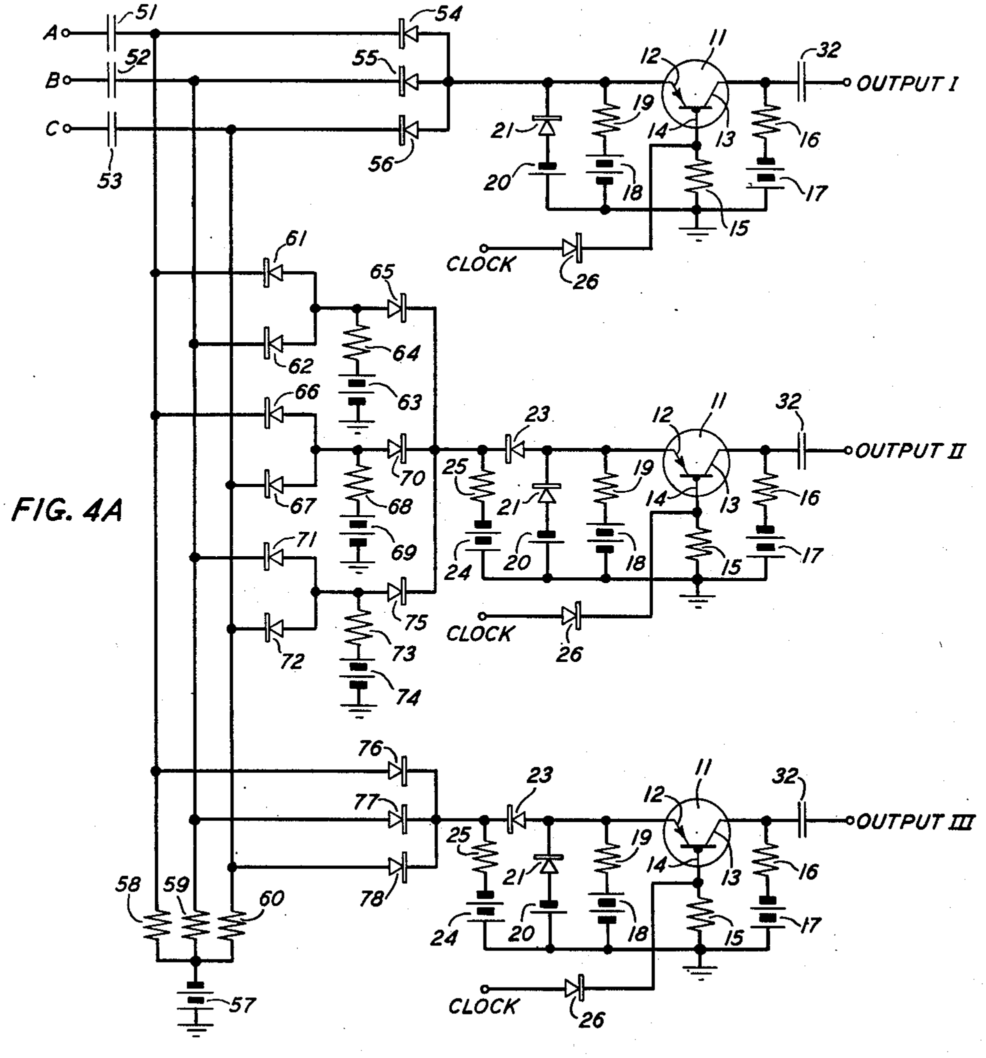
Figure 4B:
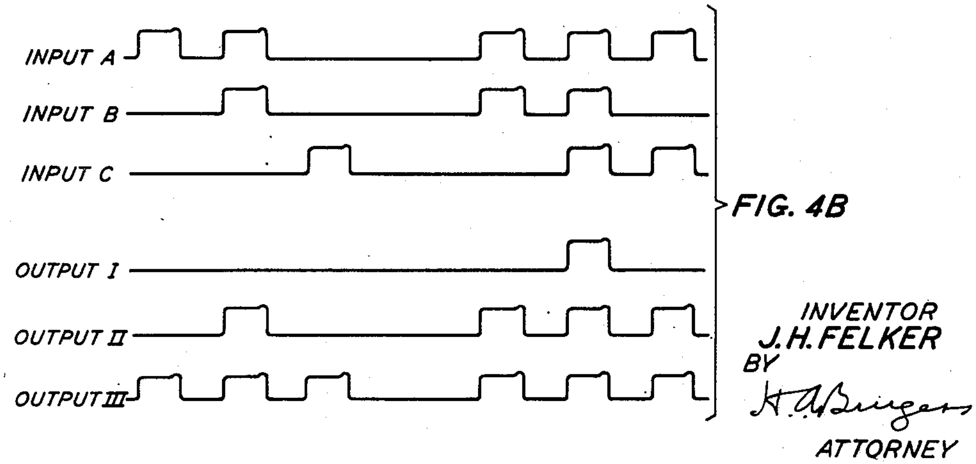
Figure 5:
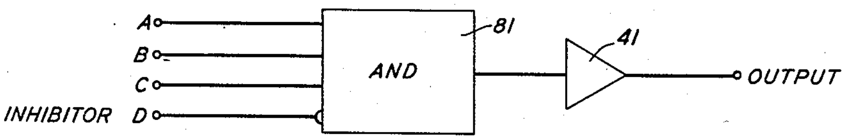
Figure 6A:
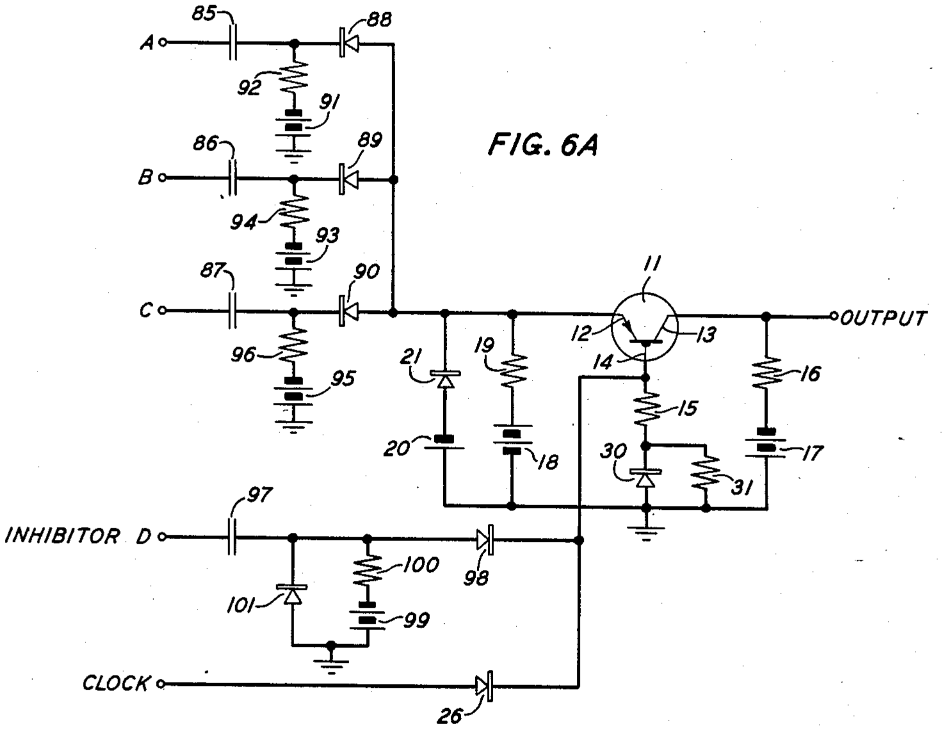
Figure 6B:
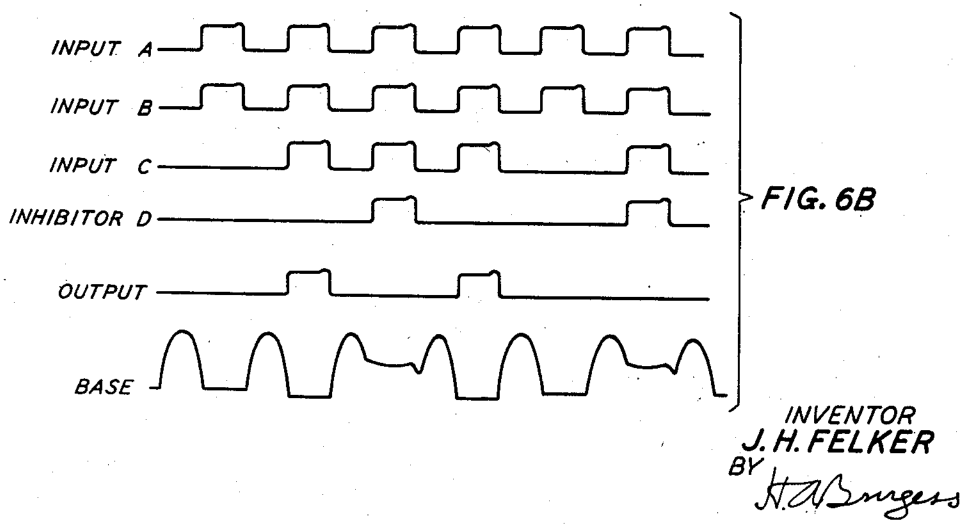

Figs. 3A, 3B, and 3C are block diagrams of several common "logic" circuits for digital computer use;

Fig. 4A is a schematic diagram of several basic digital computer components embodying the present invention, including logic circuits corresponding to those illustrated in Figs. 3A, 3B, and 3C;

Fig. 4B illustrates input and output pulse trains found in the circuit shown in Fig. 4A;

Fig. 5 is a block diagram of a logic circuit which has the property of inhibition;

Fig. 6A is a schematic diagram of a three-terminal logic circuit embodying the invention to which an inhibition terminal has been added; and Fig. 6B illustrates pulse trains found in the circuit shown in Fig. 6A.

Figure 1A:
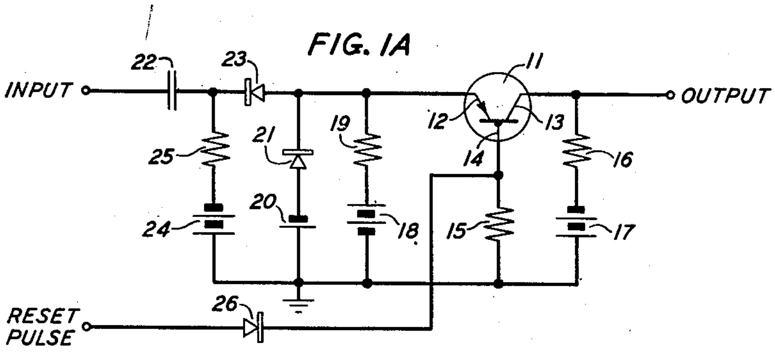
Fig. 1A is a schematic diagram of a regenerative transistor pulse amplifier embodying the invention.

In Fig. 1A, the transistor 11 possesses an emitter electrode 12, a collector electrode 13, and a base electrode 14. In the conventional symbol, the emitter is indicated by the arrow, and the direction of positive emitter current flow is indicated by the direction of the arrow. Thus, a transistor having an n-type semiconductive body is indicated by a symbol in which the emitter arrow points toward the base, while one having a p-type body is indicated by a symbol in which the emitter arrow points away from the base. For convenience in this and succeeding figures, the conventional transistor symbol has the emitter arrow pointing towards the base, and all battery and rectifier polarities are chosen for the indicated direction of positive emitter current flow. The illustrated embodiments of the invention are not, however, limited to any particular type of transistor. For positive emitter current flow in the opposite direction, all battery and rectifier polarities are reversed from those shown in the drawings.

In Fig. 1A, a base resistor 15 is connected between the base of transistor 11 and ground, while a load resistor 16 is returned from the collector to a negative voltage, conventionally represented by battery 17, which serves to bias the collector in the so-called reverse direction. The emitter is returned to a positive potential, represented by battery 18, through a "load-line" resistor 19, the resistance of which is large in comparison with the internal emitter resistance of transistor 11. In addition, the emitter is returned to a small negative potential, represented by battery 20, through a crystal diode 21 which is poled in the direction of positive emitter current flow. Signal input pulses are applied to the emitter of transistor 11 through a coupling condenser 22 and a crystal diode 23. Diode 23 is poled oppositely to the direction of positive emitter current flow, and the junction between condenser 22 and diode 23 is returned to a negative potential, represented by battery 24, through another large resistor 25. Output pulses are taken from the collector, and reset pulses are applied to the base through a crystal diode 26 which is poled for easy current flow toward that electrode.

Figure 1B:
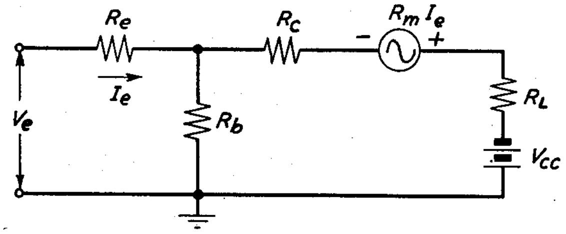
Fig. 1B is a conventional transistor equivalent circuit.

The operation of the embodiment of the invention shown in Fig. 1A may best be explained in connection with Figs. 1B, 1C, and 1D. The conventional transistor equivalent circuit shown in Fig. 1B comprises a T-network made up of the internal transistor emitter, collector, and base impedances $R_e$, $R_c$, and $R_b$. An equivalent generator $R_mI_e$ is in series with $R_c$, and a load-line resistance $R_L$ and a negative collector voltage supply $V_{cc}$ are in series between that element and $R_b$. In the equivalent generator, $R_m$ designates the transistor mutual impedance, and $I_e$ represents the emitter current. The emitter voltage $V_e$ is, as indicated, that applied between $R_e$ and $R_b$.

Figure 1C:
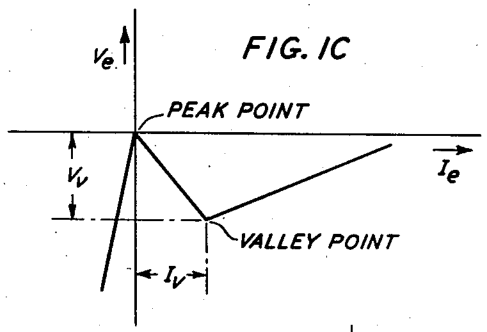
Fig. 1C is a simplified emitter-current versus emitter-voltage characteristic.

Fig. 1C is a greatly simplified illustration of the transistor emitter characteristic for a current gain ($\alpha$) greater than unity and a high base impedance. The curve is approximate and is based on a number of assumptions about the relative magnitudes of the transistor parameters. These assumptions, known as the "broken-line" assumptions, are:

(1) $R_e$, the emitter impedance, is high and constant (comparable to the back impedance of a diode) when negative emitter current flows and low and constant (comparable to the forward impedance of a diode) when positive emitter current flows.

(2) $R_b$, the base impedance, is constant.

(3) $R_c$, the collector impedance, is high and constant for negative or positive emitter currents unless the unit is saturated, in which case the collector impedance drops to a constant value of the same order as the emitter impedance.

(4) $R_m$, the mutual impedance, is zero for negative emitter current and constant and greater than $R_c$ for positive emitter current unless the unit is saturated, in which case $R_m$ is zero.

The most significant feature of the emitter characteristic is the peak voltage; the voltage, that is, at which the input resistance becomes negative. The peak voltage is generally negative, and the peak point is reached after the current gain becomes greater than unity, which is generally assumed to occur when the emitter current ceases to be negative and becomes positive. While there is some evidence that the peak point may not be reached until the emitter current is positive, in any event, the peak point is a first order effect of the base impedance and the collector current that flows when the emitter current is zero.

Another significant point on the emitter characteristic is the valley point, the point at which the transistor saturates. As the emitter current is increased, the collector current increases at a more rapid rate (if $\alpha$ is greater than unity), and the resulting base current carries the internal emitter-base-collector node negative. At the same time, the collector current carries the external collector terminal in a positive direction towards ground. When the internal node has fallen to a voltage near that of the collector terminal, the valley point has been reached, and the transistor is said to be saturated. The transistor has in effect become a passive network because the holes emitted at the emitter have reduced the effective collector impedance to a minimum value, and $R_m$ has therefore been made zero. Further increments in the emitter current divide between the base and collector circuits in accordance with their impedance levels and require that the emitter move positive.

Approximate expressions for the valley voltage and current based upon the broken-line assumptions are:

$$V_v \cong \frac{V_{cc}}{1+\left(\frac{\alpha}{\alpha-1}\right)\frac{R_L}{R_b}} \qquad (1)$$

and $$I_v \cong \frac{-V_{cc}}{(\alpha-1)R_b+\alpha R_L} \qquad (2)$$

The expression for current gain is:

$$\alpha=\frac{R_m+R_b}{R_c+R_b}=\left[\frac{i_c}{i_e}\right]_{R_L=0} \qquad (3)$$

where $i_c$ is the instantaneous collector current and $i_e$ is the instantaneous emitter current.

Figure 1D:
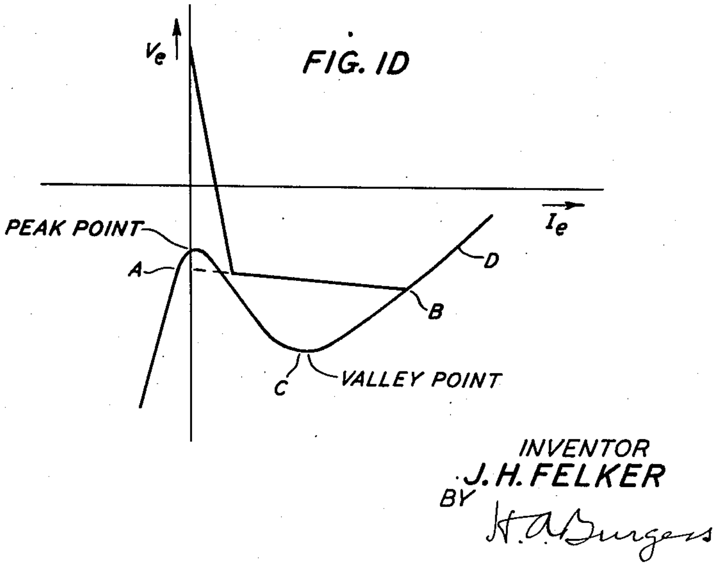
Fig. 1D illustrates the actual emitter-voltage versus emitter-current characteristic and the emitter load-line of the circuit shown in Fig. 1A.

The emitter-voltage versus emitter-current curve shown in Fig. 1D is a more accurate representation of the emitter characteristic of the embodiment of the invention illustrated in Fig. 1A. The peak point is below the $I_e$ axis, and the emitter load-lines provided by resistor 19 and diode 21 are shown. The steep load-line to the left is provided by resistor 19, the slope depending upon its resistance and the intercept on the $V_e$ axis being determined by the voltage supplied by battery 18. The flatter right-hand load-line is provided by diode 21, its slope being determined by the resistance of diode 21 in the direction of easy current flow and its $V_e$ axis intercept being determined by the voltage supplied by battery 20. The magnitudes of the voltages supplied by batteries 18 and 20 are selected so that, as indicated, the load-lines of resistor 19 and diode 21 intersect just to the right of and above the negatively sloped portion of the emitter characteristic, the load-line of diode 21 intersecting the positively sloped portion of the emitter characteristic in the positive current region and the load-line of diode 21 intersecting the $V_e$ axis below the peak point of the emitter characteristic.

In the embodiment of the invention shown in Fig. 1A, resistors 19 and 25 are chosen so that, in the absence of emitter current, the emitter of transistor 11 rests at a voltage below the bias on diode 21. This is point A in Fig. 1D. When the input goes above the peak point, diodes 21 and 23 are cut off, and the current set by resistor 19 begins to flow into the emitter. Because of the negative input impedance, the positive emitter current causes the emitter voltage to fall towards C. If the negative resistance is high enough and the unit has sufficient high frequency gain, the emitter current will snap out to point B. The circuit will then stay locked up at B indefinitely unless the emitter is pulled below the valley point C or the base is pushed positive. It will be noted that because of the negative impedance at the emitter, the load-line can be switched from a high impedance offered by resistor 19 to the low impedance offered by diode 21 when conducting. This gives the circuit a large current gain at the emitter. The emitter current is multiplied by the current gain of the transistor 11 to give a large practical current gain at the collector. The minimum triggering current is influenced by the slope of the curve between points A and C. It will be noted in this connection that if the load-line of resistor 19 does not intersect the load-line of diode 21 before it intersects the transistor emitter characteristic, in situations involving transistors with restricted band widths the transistor will not operate beyond the negative impedance portion of the characteristic, and the collector signal will be very small.

The circuit which has been described is actually a flip-flop circuit rather than an amplifier. In order to make it an amplifier, it is customary to replace diode 21 with a capacitor. If that is done, when the emitter current has snapped out to line DC, the capacitor charges down line DC. When the emitter voltage reaches the valley point, the current snaps to the low current state, the capacitor discharges to A, and the unit locks in at the low current state. Thus, the circuit develops an output pulse in return for each input triggered. There are at least two disadvantages to using a condenser to provide automatic cut-off in high-speed application. One is that the duration of the output pulse depends upon the slope of the transistor characteristic between points C and D. Another is that in triggering the circuit the condenser must be charged from voltage A to the peak point. This means that if significant delays are to be avoided in high-speed applications, a larger triggering current is required than when diode 21 is used. The circuits shown in Fig. 1A can be triggered by a quarter of a milliampere without delays significant to a computer operating at a megacycle rate.

Turning off the circuit shown in Fig. 1A by a voltage applied at the emitter is extremely difficult, since the emitter has to be pulled negative to the valley voltage and the voltage drop has to be developed across the low impedance of conducting diode 21. However, the circuit can be shut off by a positive reset pulse applied at the base of transistor 11 through diode 26. It will be seen that transistor 11 can go to its high current state in this circuit only when the reset pulse is not present and will always be driven back to the low current state by the next reset pulse which is applied to the base. Therefore, the onset and the duration of each output pulse are under the control of the reset pulses and are substantially independent of the transistor, the shape of the input pulses, and the circuit parameters.

This feature of the present invention makes it a very simple matter to obtain the rigid synchronism required in a serial computer or switching system. Sine wave "clock" signals are applied to the bases of the transistor amplifiers through diodes. The phase of the signal fed to the base of each amplifier is chosen so that the potential of that electrode will fall to ground just after the latest time at which an input pulse, if present at all, could have risen. Then the output, if any, is in synchronism with the clock and not the input. The circuit is, therefore, a pulse standardizer as well as an amplifier.

The presence of diodes 21 and 23 also provides direct-current restoration of incoming signal pulses. Coupling condenser 22 is charged by the incoming pulses into the high impedance provided by resistor 25 but is discharged through the low resistance provided by diodes 21 and 23. Condenser 22 is thereby enabled to discharge completely between pulses, and the direct voltage level of the junction between condenser 22 and diode 23 is always returned to the point determined by battery 20.

Thus, not only does diode 21 provide an emitter load-line which intersects the emitter-voltage versus emitter-current characteristic at a high current point, but it also acts with diode 23 in providing direct-current restoration of the incoming pulses. Condenser 22 may, of course, be omitted if the incoming pulses are already at the desired direct voltage level, since its principal purpose is to isolate the circuit of transistor 11 from the direct voltage level of the incoming signal pulses. Diode 23, on the other hand, serves to isolate the flip-flop circuit associated with transistor 11 from preceding circuits by freeing the input terminal from any necessity of following the emitter on its negative excursions. In other words, when the emitter snaps negative, it will not drag down the input voltage, which is free to continue to rise.

Figure 2A:
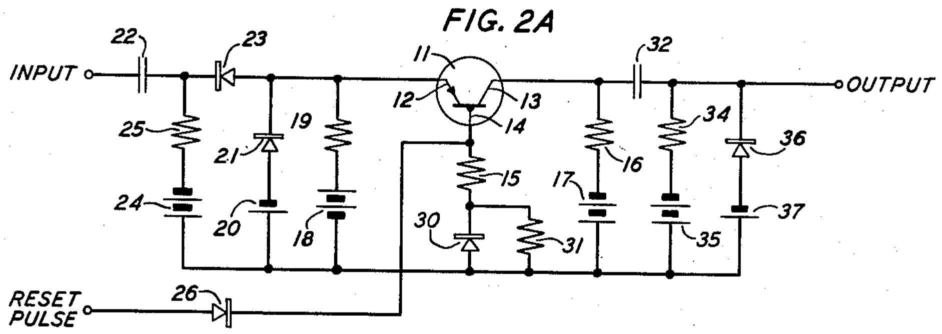
Fig. 2A is a schematic diagram of a variation of the embodiment of the invention shown in Fig. 1A.

A variation of the embodiment of the invention shown in Fig. 1A is illustrated schematically in Fig. 2A. In the circuit of Fig. 2A, a crystal diode 30, poled for easy current flow toward the base electrode of transistor 11, is connected in series between base resistor 15 and ground to present a high base impedance when the transistor base is driven positive and to present a low impedance when the transistor is triggered. Diode 30 is shunted by a resistor 31 to provide a path for discharging stray capacities.

The initial elements of a typical load for high-speed switching and digital computer applications of the present invention is shown to the right of load resistor 16 in Fig. 2A. Specifically, a coupling condenser 32 is connected between the collector of transistor 11 and the terminal which is, for convenience, termed the output terminal. From the output terminal, a large resistor 34 is returned to a negative potential, conventionally represented by battery 35, and a crystal diode 36, poled for easy current flow from ground toward the output terminal, is returned to a negative potential represented by battery 37. This type of load provides direct-current restoration of the output signal so that the pulses going to the next diode network will always start at the level fixed by battery 37. In addition, when conducting, diode 36 provides a very low load impedance for the transistor when it first starts to flip to the high current state, speeding up the regenerative operation. Once the collector voltage has risen appreciably, diode 36 is cut off.

Figure 2B:
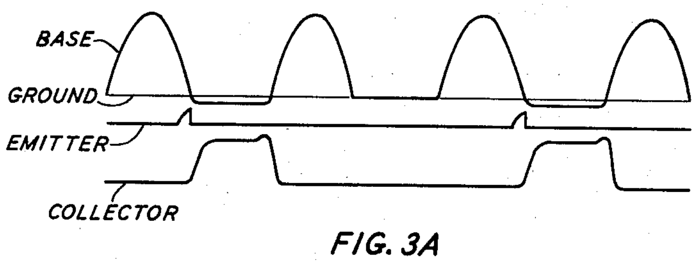
Fig. 2B illustrates wave forms appearing in the circuit shown in Fig. 2A.

A few of the more important wave forms found in the embodiment of the invention shown in Fig. 2A appear in Fig. 2B, where voltage is plotted against time. The upper curve illustrates the wave form appearing at the base. A sine wave of suitable frequency (one megacycle, for example), applied through diode 26 produces the train of positive reset or clock pulses shown, and the transistor base goes slightly negative during the passage of each emitter current pulse. The middle curve illustrates the emitter voltage wave form, while the lower curve depicts the collector voltage wave form. As shown, only the signal at the emitter can produce an output pulse, and it can produce one only during the intervals set by the base or clock signal. In the absence of a base pulse, the circuit is triggered to its high current state when the emitter voltage reaches the peak point. The emitter voltage falls to the value indicated by point B in Fig. 1D with the triggering, and the collector voltage pulse continues until the base is driven positive by the next clock pulse.

By way of example, the following list of circuit parameters for the circuit of Fig. 2A is given as being typical for many embodiments of the invention.

| | |
|---|---|
| Resistor 15 | 470 ohms. |
| Resistor 16 | 470 ohms. |
| Battery 17 | −3 volts. |
| Battery 18 | +12 volts. |
| Resistor 19 | 24,000 ohms. |
| Battery 20 | −1 volt. |
| Condenser 22 | 0.01 microfarad. |
| Battery 24 | −8 volts. |
| Resistor 25 | 3900 ohms. |
| Resistor 31 | 5100 ohms. |
| Condenser 32 | 0.01 microfarad. |
| Resistor 34 | 10,000 ohms. |
| Battery 35 | −24 volts. |
| Battery 37 | −2 volts. |

The various rectifiers may be any suitable crystal diodes or other asymmetrically conducting devices, and transistor 11 is preferably a unit having a value of $\alpha$ of the order of 2.

As has been indicated, the embodiments of the invention illustrated in Figs. 1A and 2A are particularly adaptable for use in high-speed switching or digital computer systems. It is possible, for example, to construct a digital computer in which all logic operations are performed in passive diode circuits and in which active elements are used only as gain producing devices to make up for attenuation in the diode circuits. The regenerative pulse amplifiers shown in Figs. 1A and 2A may be employed advantageously for that purpose.

Figs. 3A, 3B, and 3C are block diagrams of three common "logic" circuits. The one in Fig. 3A comprises input terminals labeled A, B, and C, a so-called "AND" circuit 40, an amplifier 41, and an output terminal and develops an output only if all three of its input terminals are energized. The circuit in Fig. 3B comprises similar input terminals labeled A, B, and C, AND circuits 42, 43, and 44, one for each pair of input terminals, a so-called "OR" circuit 45, an amplifier 41, and an output terminal and develops an output whenever at least two of its three inputs are energized. The one in Fig. 3C comprises input terminals labeled A, B, and C, an "OR" circuit 46, an amplifier 41, and an output terminal. In these diagrams, as has been indicated, an AND circuit is one which develops an output pulse only when all of its inputs are energized, while an OR circuit is one which develops an output when any one of its inputs is energized. It will be noted that the same amplifier circuit may be used in all three of the circuits illustrated.

Fig. 4A is a schematic diagram of a specific computer component embodying the present invention which includes portions corresponding to respective ones of the logic circuits illustrated in Figs. 3A, 3B, and 3C. It will be seen that the circuit shown in Fig. 4A is roughly divided into three sections, the first or upper one corresponds to the block diagram shown in Fig. 3A, the second or middle one corresponds to the block diagram shown in Fig. 3B, while the third or lower one corresponds to the block diagram shown in Fig. 3C. Amplifiers corresponding to the regenerative pulse amplifier shown in Figs. 1A and 2A are used as the active elements in all three sections.

In Fig. 4A, the input terminals labeled A, B, and C are connected to coupling condensers 51, 52, and 53, respectively. A crystal diode 54, poled oppositely to the direction of positive emitter current flow, is connected between condenser 51 and the emitter of transistor 11 in the first or upper section of the figure. Similarly poled diodes 55 and 56 are connected between condensers 52 and 53, respectively, and the same electrode. The junction between condenser 51 and diode 54 is returned to a negative potential, represented by a battery 57, through a high resistance 58, while the corresponding points between condensers 52 and 53 and diodes 55 and 56 are returned to the same potential through resistors 59 and 60, respectively. Diodes 54, 55, and 56 take the place of diode 23 in the regenerative amplifier circuit.

Explanation of the operation of these and the other portions of the circuit shown in Fig. 4A may best be made in connection with Fig. 4B. Illustrated there are a number of wave forms representing pulses which may be applied to input terminals A, B, and C and pulses which appear at the various output terminals upon application of the input pulses shown. Thus, when pulses corresponding to those shown in the first three lines in Fig. 4B are applied to terminals A, B, and C, a series of pulses corresponding to those shown in the fourth line appears at the output terminal in the first or upper section of the circuit shown in Fig. 4A. An output pulse is developed when and only when an input pulse is applied to all three of terminals A, B, and C. For example, when a positive pulse is applied to terminal A only, diodes 55 and 56 are not cut off, and the limiter will be held below the peak point. However, when positive pulses are applied to all three input terminals, all three diodes 54, 55, and 56 are cut off, and triggering action takes place because the emitter is raised above the peak point.

In the second or middle portion of Fig. 4A, a pair of crystal diodes 61 and 62, poled oppositely to the direction of positive emitter current flow, are connected between condensers 51 and 52, respectively, and a common point which is returned to a positive potential, represented by battery 63, through a large resistance 64. That point is, in turn, connected to the junction between resistor 25 and diode 23 in the regenerative amplifier through a crystal diode 65 which is poled in the direction of positive emitter current flow. A similar combination, including a pair of crystal diodes 66 and 67 which are poled oppositely to the direction of positive emitter current flow, a resistance 68 and a battery 69, and a crystal diode 70, which is poled in the direction of positive emitter current flow, is connected between condensers 51 and 53 and the junction of resistor 25 and diode 23. Still a third such combination, including a pair of crystal diodes 71 and 72 poled oppositely to the direction of positive emitter current flow, a resistor 73 and a battery 74, and a crystal diode 75, poled in the direction of positive emitter current flow is connected between condensers 52 and 53 and that same junction point.

The output of the second or middle section of the circuit shown in Fig. 4A is illustrated on the fifth line of Fig. 4B. As shown, an output pulse is generated when a pulse is applied to any two of the input terminals. Diodes 61 and 62, 66 and 67, and 71 and 72 form AND circuits which pass pulses only when both inputs are energized. Diodes 65, 70, and 75, on the other hand, form an OR circuit which passes a pulse when any one of its inputs is energized. Thus, when an input pulse is applied only to terminal A, diodes 61 and 66 are cut off, but diodes 62 and 67 are not. Neither AND circuit, therefore, passes the pulse. However, when pulses are applied to both terminals A and B, both diodes 61 and 62 are cut off, and a positive voltage is developed across resistor 64. The OR circuit then passes the pulse through diode 65, and a positive voltage is developed across resistor 25, triggering the regenerative amplifier. Diodes 70 and 75 are already in their high resistance state with respect to the pulse passed by diode 65 and do not interfere.

In the third or lower portion of Fig. 4A, a crystal diode 76 poled in the direction of positive emitter current flow is connected between condenser 51 and the junction between resistor 25 and diode 23. A pair of similarly poled crystal diodes 77 and 78 are connected to that same point from condensers 52 and 53, respectively. This arrangement constitutes an OR circuit which causes the regenerative amplifier to be triggered whenever an input pulse is applied to any one of terminals A, B, or C, as shown on the bottom line of Fig. 4B. When, for example, a positive pulse is applied to terminal A, it is passed by diode 76 without being affected by diodes 77 and 78, which present a high impedance to it. A positive voltage is developed across resistor 25, triggering the regenerative amplifier.

The basic high-speed digital computer components shown schematically in Fig. 4A illustrate the adaptability of regenerative amplifiers embodying the present invention for such use. For a basic pulse repetition rate of one megacycle and a pulse width of half a microsecond, the following list of circuit parameters may be taken as typical:

| | |
|---|---|
| Resistor **15** | 470 ohms. |
| Resistor **16** | 470 ohms. |
| Battery **17** | −8 volts. |
| Battery **18** | +24 volts. |
| Resistor **19** | 100,000 ohms. |
| Battery **20** | −1 volt. |
| Battery **24** | −24 volts. |
| Resistor **25** | 56,000 ohms. |
| Condenser **32** | 0.01 microfarad. |
| Condensers **51**, **52**, **53** | 0.01 microfarad. |
| Battery **57** | −24 volts. |
| Resistors **58**, **59**, **60** | 10,000 ohms. |
| Batteries **63**, **69**, **74** | +24 volts. |
| Resistors **64**, **68**, **73** | 47,000 ohms. |

The one-megacycle sine wave is applied to the "clock" or "reset" terminal of each amplifier in order to restore the circuits to their low current states after triggering and to provide pulse standardization and control.

A block diagram of another common logic circuit to which embodiments of the present invention are readily adaptable appears in Fig. 5. A three-terminal AND circuit 81 and an amplifier 41 are connected in series between the input terminals labeled A, B, and C and the output terminal. An inhibition terminal D has been added to the AND circuit. The circuit shown has an output only when all three inputs are present, and an inhibiting pulse is not.

An AND circuit with inhibition which embodies the present invention is shown in Fig. 6A. The regenerative amplifier is similar to those which have already been described, and three input terminals, labeled A, B, and C, are provided. Coupling condensers 85, 86, and 87 are connected to terminals A, B, and C, respectively, and crystal diodes 88, 89, and 90, respectively, are connected between them and the emitter of transistor 11. Each diode is poled oppositely to the direction of positive emitter current flow, forming an AND circuit. The junction between condenser 85 and diode 88 is returned to a negative potential, conventionally represented by a battery 91, through a resistor 92. Similarly, the junction between condenser 86 and diode 89 is returned to a negative potential, represented by a battery 93, through a resistor 94, and the junction between condenser 87 and diode 90 is returned to a negative potential, represented by battery 95, through a resistor 96. The inhibition terminal is labeled D, and a coupling condenser 97 is connected to it, while a crystal diode 98 is connected between condenser 97 and the base of transistor 11. Diode 98 is poled for easy current flow from the inhibition terminal D toward the base, and the junction between condenser 97 and diode 98 is returned to a negative potential, represented by a battery 99, through a resistor 100. A crystal diode 101, poled for easy current flow from ground toward diode 98, is connected in parallel with the series combination of resistor 100 and battery 99.

The operation of the circuit shown in Fig. 6A is illustrated by the various wave forms shown in Fig. 6B. The three upper pulse trains represent the input signals applied to terminals A, B, and C, the fourth line illustrates the pulses applied to inhibition terminal D, the fifth line represents the output pulses generated by the transistor amplifier, and the bottom line illustrates the wave forms appearing at the base electrode of transistor 11. As has been indicated, diodes 88, 89, and 90 form an AND circuit which passes a pulse only when one is applied to all three inputs. When a pulse is applied to only one or two inputs, the other diodes are not cut off, and no pulse appears at the emitter of transistor 11. As has been stated previously, the presence of the clock pulses at the base of transistor 11 not only serves to reset the circuit to its low current state after it has been triggered but also serves to prevent the generation of pulses during intervals in which the positive base pulse is present. Thus, the regular clock pulses applied to the base serve both to convert the flip-flop circuit into an amplifier and to standardize the generated pulses. In the circuit shown in Fig. 6A, the property of inhibition is further taken advantage of by the use of the inhibition terminal D and the associated network. As shown on the bottom line of Fig. 6B, the presence of pulses at inhibition terminal D serves in effect to fill in the blanks between the regular clock or reset pulses. Inhibition can thus be controlled by an external signal as well as by the regular clock built into the system.

For the same basic pulse repetition rate and pulse widths as used in the circuits of Fig. 4A, i. e., a pulse repetition rate of one megacycle and a pulse width of half of a microsecond, the following list of circuit parameters may be taken as typical for the circuit of Fig. 6A:

| | |
|---|---|
| Resistor 15 | 470 ohms. |
| Resistor 16 | 470 ohms. |
| Battery 17 | —8 volts. |
| Battery 18 | +24 volts. |
| Resistor 19 | 100,000 ohms. |
| Battery 20 | —1 volt. |
| Resistor 31 | 5100 ohms. |
| Condensers 85, 86, 87 | 0.01 microfarad. |
| Batteries 91, 93, 95 | —24 volts. |
| Resistors 92, 94, 96 | 24,000 ohms. |
| Condenser 97 | 0.01 microfarad. |
| Battery 99 | —24 volts. |
| Resistor 100 | 24,000 ohms. |

As in the other examples, a sine wave of a megacycle frequency is applied to the clock terminal.

In connection with the examples of basic computer components embodying the present invention which have been described, it should be remembered that the specific numbers of input terminals used in the specific combinations of AND, OR, or inhibition circuits shown are only representative of a much larger range of combinations. The present invention may be employed to advantage in a large number of high-speed switching and computer systems as well as in many other unnamed applications. Further, it is to be understood that the above-described arrangements are illustrative of the application of the principles of the invention. Numerous other arrangements may be devised by those skilled in the art without departing from the spirit and scope of the invention.

What is claimed is:

1. A regenerative pulse amplifier which comprises, in combination, a flip-flop circuit comprising a transistor having emitter, collector, and base electrodes, a base resistance common to the emitter-base and the collector-base paths of said transistor, and a resistance and an asymmetrically conducting device poled in the direction of positive emitter current flow connected in the emitter-base path to provide an emitter load-line for said transistor, circuit means to supply signal pulses to said emitter electrode to trigger said flip-flop circuit to its high current state, and circuit means to supply a regular succession of pulses to said base electrode to reset said flip-flop circuit to its low current state and to regulate the output pulses produced thereby.

2. A regenerative pulse amplifier which comprises, in combination, a flip-flop circuit comprising a transistor having emitter, collector, and base electrodes, a base resistance common to the emitter-base and the collector-base paths of said transistor, and a resistance and a first source of direct voltage connected in series between said emitter electrode and said base resistance and an asymmetrically conducting device and a second source of direct voltage connected in series between said emitter electrode and said base resistance to provide an emitter load-line for said transistor, said asymmetrically conducting device being poled in the direction of positive emitter current flow, circuit means to supply signal pulses to said emitter electrode to trigger said flip-flop circuit to its high current state, and circuit means to supply a regular succession of pulses to said base electrode to reset said flip-flop circuit to its low current state and to regulate the output pulses produced thereby.

3. A regenerative pulse amplifier which comprises, in combination, a flip-flop circuit comprising a transistor having emitter, collector, and base electrodes, a base resistance common to the emitter-base and the collector-base paths of said transistor, a resistance and a source of direct voltage connected in series between said emitter electrode and said base resistance, and an asymmetrically conducting device and another source of direct voltage also connected in series between said emitter electrode and said base resistance, the quiescent direct voltage level of said base electrode being between the respective direct voltages supplied by said sources and said asymmetrically conducting device being poled in the direction of positive emitter current flow, circuit means to supply signal pulses to said emitter electrode to trigger said flip-flop circuit to its high current state, and circuit means to supply a regular succession of pulses to said base electrode to reset said flip-flop circuit to its low current state and to regulate the output pulses produced thereby.

4. A regenerative pulse amplifier which comprises, in combination, a flip-flop circuit comprising a transistor having emitter, collector, and base electrodes, a base resistance common to the emitter-base and the collector-base paths of said transistor, a resistance and a first source of direct voltage poled to bias said emitter electrode in the forward direction connected in series between said emitter electrode and said base resistance, and an asymmetrically conducting device poled in the direction of positive emitter current flow and a second source of direct voltage poled oppositely from said first source of direct voltage connected in series between said emitter electrode and said base resistance, circuit means to supply signal pulses to said emitter electrode to trigger said flip-flop circuit to its high current state, and circuit means to supply a regular succession of pulses to said base electrode to reset said flip-flop circuit to its low current state and to regulate the output pulses produced thereby.

5. A regenerative pulse amplifier which comprises, in combination, a single-transistor flip-flop circuit, circuit means to supply signal pulses to the emitter electrode of the transistor to trigger said flip-flop circuit to its high current state, and circuit means to supply a regular succession of pulses to the base electrode of the transistor to reset said flip-flop circuit to its low current state and to regulate the pulses produced thereby.

6. A regenerative pulse amplifier which comprises, in combination, a flip-flop circuit comprising a transistor having emitter, collector, and base electrodes, a base resistance common to the emitter-base and collector-base paths of said transistor, a resistance and a first source of direct voltage poled to bias said emitter electrode in the forward direction connected in series between said emitter electrode and said base resistance, and a first asymmetrically conducting device poled in the direction of positive emitter current flow and a second source of direct voltage poled oppositely from said first source of direct voltage connected in series between said emitter electrode and said base resistance, circuit means including a second asymmetrically conducting device poled in the direction opposite to that of positive emitter current flow to supply signal pulses to said emitter electrode to trigger said flip-flop circuit to its high current state, and circuit means to supply a regular succession of pulses to said base electrode to reset said flip-flop circuit to its low current state and to regulate the output pulses produced thereby.

7. In combination, a regenerative pulse amplifier comprising a single-transistor flip-flop circuit, circuit means to supply signal pulses to the emitter electrode of the transistor to trigger said flip-flop circuit to its high current state, and circuit means to supply a regular succession of pulses to the base electrode of the transistor to reset said flip-flop circuit to its low current state and to regulate the pulses produced thereby, and circuit means to supply pulses to the base electrode of the transistor in the intervals between regular base pulses to prevent the generation of pulses by said amplifier.

JEAN H. FELKER.

References Cited in the file of this patent

UNITED STATES PATENTS

| Number | Name | Date |
|---|---|---|
| 2,531,076 | Moore | Nov. 21, 1950 |